(12) United States Patent
Patzer et al.

(10) Patent No.: US 9,177,874 B2
(45) Date of Patent: Nov. 3, 2015

(54) METHOD OF FORMING A SEMICONDUCTOR DEVICE EMPLOYING AN OPTICAL PLANARIZATION LAYER

(71) Applicant: GLOBALFOUNDRIES Inc., Grand Cayman (KY)

(72) Inventors: Joachim Patzer, Langebrueck (DE); Ardechir Pakfar, Dresden (DE); Dominic Thurmer, Dresden (DE); Chih-Chun Wang, Dresden (DE); Remi Riviere, Dresden (DE); Robert Melzer, Radebeul (DE); Bastian Haussdoerfer, Dresden (DE); Martin Weisheit, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 69 days.

(21) Appl. No.: 14/012,563

(22) Filed: Aug. 28, 2013

(65) Prior Publication Data

US 2015/0064812 A1 Mar. 5, 2015

(51) Int. Cl.

| H01L 21/00 | (2006.01) |
|---|---|
| H01L 21/66 | (2006.01) |
| H01L 21/8238 | (2006.01) |
| H01L 27/06 | (2006.01) |
| H01L 21/311 | (2006.01) |
| H01L 21/3105 | (2006.01) |

(52) U.S. Cl.
CPC ........ *H01L 22/12* (2013.01); *H01L 21/823828* (2013.01); *H01L 21/823878* (2013.01); *H01L 27/0629* (2013.01); *H01L 21/31058* (2013.01); *H01L 21/31144* (2013.01)

(58) Field of Classification Search
CPC .................. H01L 21/31111; H01L 21/31144; H01L 22/12; H01L 27/0629; H01L 21/31058
See application file for complete search history.

(56) References Cited

U.S. PATENT DOCUMENTS

| 8,871,651 B1 * | 10/2014 | Choi et al. | 438/717 |
| 2011/0091815 A1 * | 4/2011 | Dunn et al. | 430/313 |

OTHER PUBLICATIONS

U.S. Appl. No. 13/765,797, filed Feb. 12, 2013.

* cited by examiner

*Primary Examiner* — Richard Booth
(74) *Attorney, Agent, or Firm* — Amerson Law Firm, PLLC

(57) ABSTRACT

A method for the manufacture of a semiconductor device is provided, including the steps of providing a semiconductor substrate including a first area separated from a second area by a first isolation region, wherein the second area includes an intermediate transistor comprising a gate electrode, forming an oxide layer over the first and second areas, forming an optical planarization layer (OPL) over the oxide layer, forming a mask layer over the OPL in the first area without covering the OPL in the second area, and etching the OPL with the mask layer being present to expose the oxide layer over the gate electrode of the transistor.

22 Claims, 7 Drawing Sheets

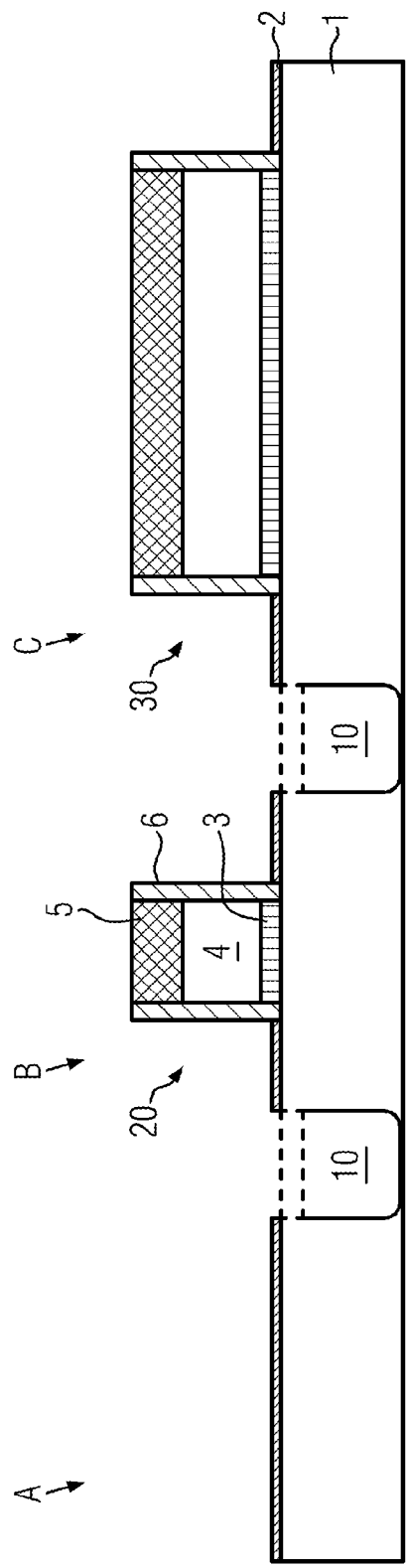
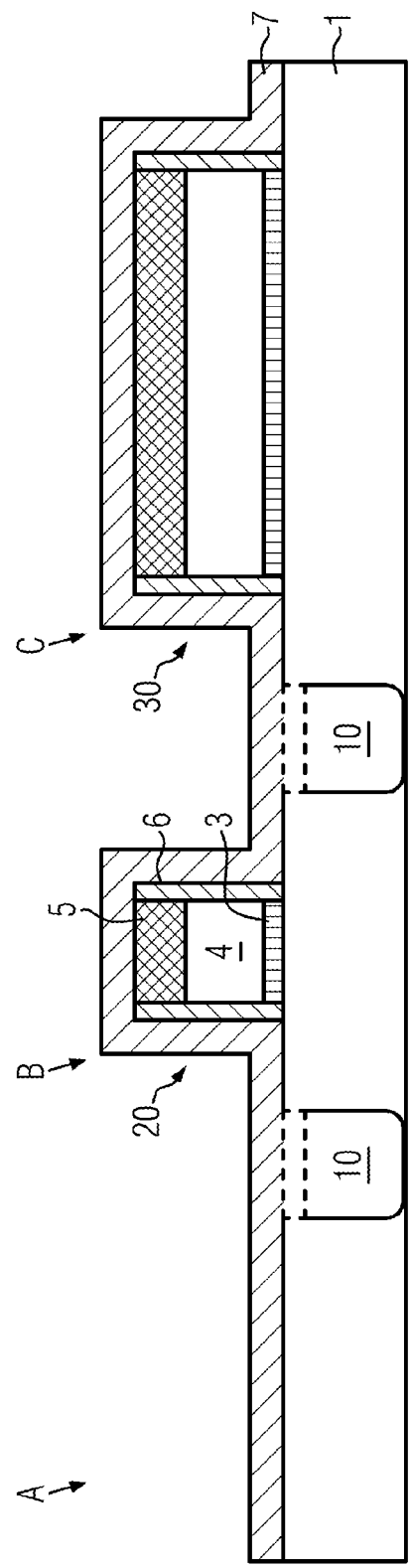

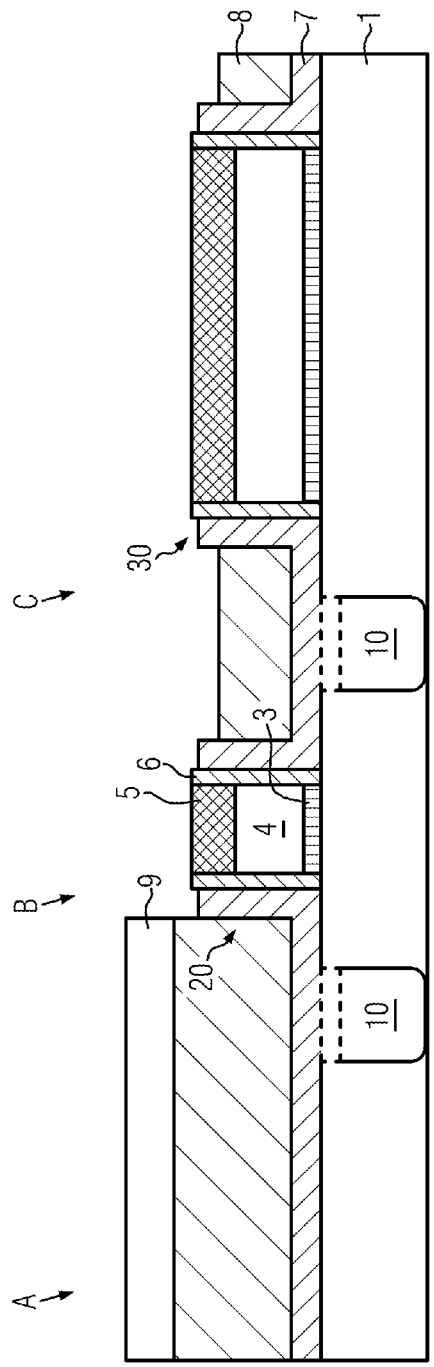
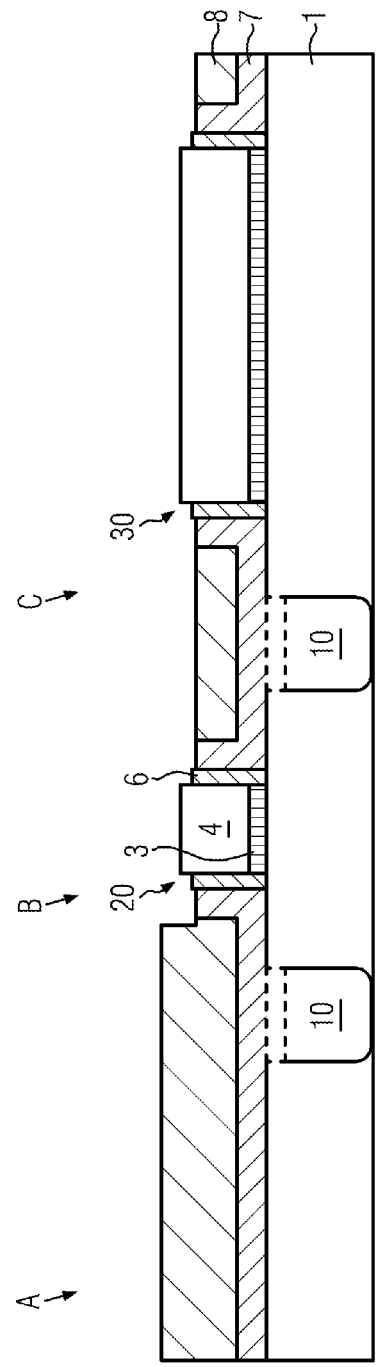
FIG. 1f
FIG. 1g

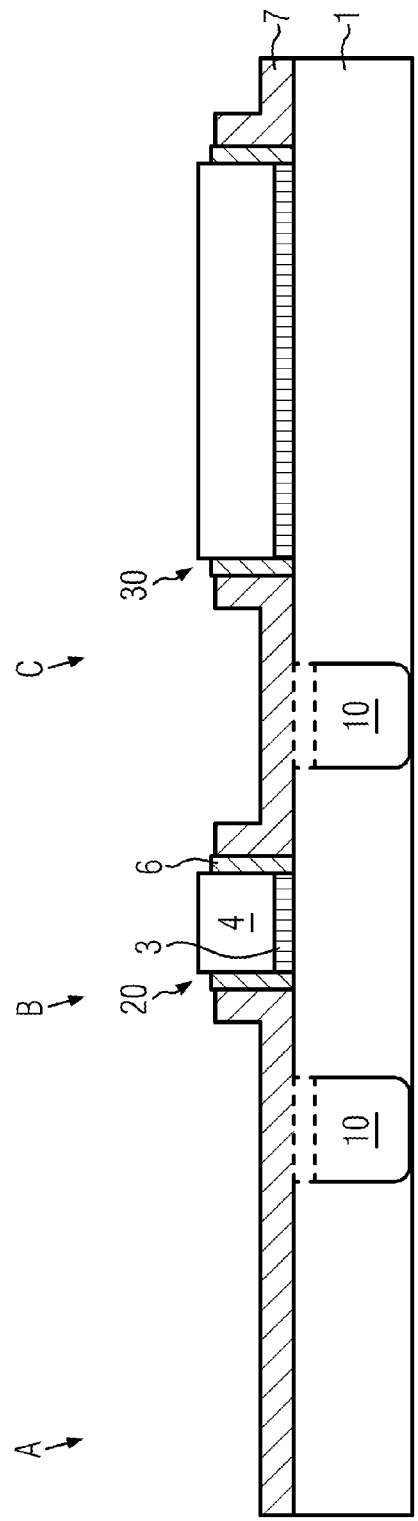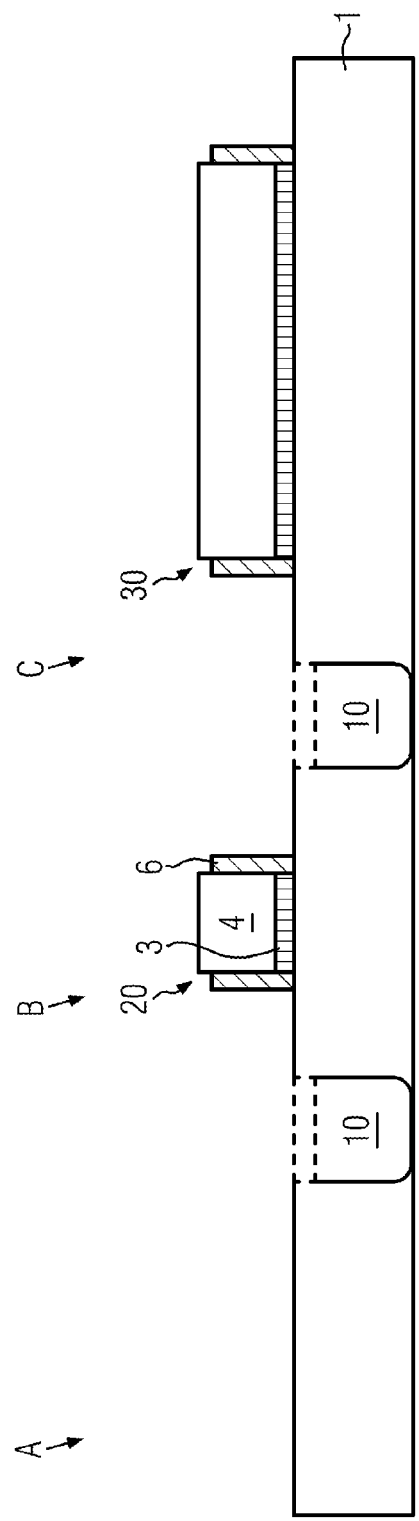

METHOD OF FORMING A SEMICONDUCTOR DEVICE EMPLOYING AN OPTICAL PLANARIZATION LAYER

BACKGROUND OF THE INVENTION

1. Field of the Invention

Generally, the present disclosure relates to the field of integrated circuits and semiconductor devices, and, more particularly, to the formation of semiconductor devices employing an optical planarization layer.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, for example, N-channel transistors and/or P-channel transistors, are formed on a substrate including a crystalline semiconductor layer.

A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length is a dominant design criterion for accomplishing an increase in the operating speed of the integrated circuits.

Particularly for transistor devices with very short channel lengths, for example, of some 10 nm, gate structures with high-k dielectric gate insulating layers and one or more metal layers functioning as a gate electrode have been provided that show improved operational characteristics as compared to conventional silicon dioxide/polysilicon gates. The high-k isolation layers may include or consist of tantalum oxide, hafnium oxide, titanium oxide or hafnium silicates, for example.

There are basically two well-known processing methods for forming a planar or 3D transistor with a high-k/metal gate structure: the so-called "gate last" or "replacement gate" technique and the so-called "gate first" technique. In the replacement gate technique, a so-called "dummy" or sacrificial gate structure is initially formed and remains in place as many process operations are performed to form the device, for example, the formation of doped source/drain regions, performing an anneal process to repair damage to the substrate caused by the ion implantation processes and to activate the implanted dopant materials. At some point in the process flow, the sacrificial gate structure is removed to define a gate cavity where the final HK/MG gate structure for the device is formed. Using the "gate first" technique, on the other hand, involves forming a stack of layers of material across the substrate, wherein the stack of materials includes a high-k gate isolation layer, one or more metal layers, a layer of polysilicon, and a protective cap layer, for example, silicon nitride. One or more etching processes are performed to pattern the stack of materials to thereby define the basic gate structures for the transistor devices.

The protective cap layer particularly protects the gate during an embedded silicon/germanium (SiGe) sequence carried out in order to form source and drain regions, etc. Sidewall spacers are usually formed at sidewalls of the patterned gate structure and a sacrificial oxide layer is formed on the sidewall spacers and the wafer surface to protect the sidewall spacers when the protective cap layer is removed in a later processing step. Horizontal portions of the sacrificial oxide layer are removed, thereby exposing the protective cap layer. After completion of the embedded SiGe sequence, the protective cap layer is to be removed in order to ensure stable silicidation of the gate. A metal silicide may typically be formed in the gate electrode, which may comprise polysilicon material, thereby enhancing conductivity and thus reducing signal propagation delay. Although an increased amount of metal silicide in the gate electrode may per se be desirable in view of reducing the overall resistance thereof, a substantially complete silicidation of the polycrystalline silicon material down to the gate dielectric material may not be desirable in view of threshold voltage adjustment of the corresponding transistor element. It may, therefore, be desirable to maintain a certain portion of the doped polysilicon material in direct contact with the gate dielectric material so as to provide well-defined electronic characteristics in the channel region, so as to avoid significant threshold variations, which may be caused by a substantially full silicidation within portions of the gate electrode.

However, during the processing steps of removal of the sacrificial oxide and the protective cap layer, for example, comprising or made of SiN, extended active device areas of the wafer are undesirably affected, i.e., material in large active device regions formed close to the transistor device comprising the protective cap layer in an intermediate state is conventionally removed, resulting in a performance loss of the final semiconductor device.

In view of the situation described above, the present disclosure provides techniques that allow for the formation of a semiconductor device comprising etching of a sacrificial oxide layer (a protective cap layer) formed on a gate of a transistor without significantly attacking an active device area of the semiconductor device.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method for the manufacture of a semiconductor device includes the steps of providing a semiconductor substrate having a first area separated from a second area by a first isolation region, wherein the second area includes an intermediate transistor (not fully completed/operable transistor device) comprising a gate electrode, forming an oxide layer over the first and second areas, forming an optical planarization layer (OPL) over the oxide layer, forming a mask layer over the OPL in the first area without covering the OPL in the second area, and etching the OPL with the mask layer being present to expose the oxide layer over the gate electrode of the transistor. It is noted that herein, by the term semiconductor device, both an operable and fully completed device and an intermediate semiconductor device is covered.

It is further provided herein a method of forming a semiconductor device, including providing a semiconductor substrate comprising one or more semiconductor devices, forming an oxide layer over the semiconductor substrate, forming an optical planarization layer (OPL) over the oxide layer, determining etching parameters for etching back the OPL by means of performing etch-back test processes based on atomic force microscopy on the same semiconductor substrate (without destroying it), and etching back the OPL based on the determined etching parameters. The etch-back test processes are performed for previously formed and etched back OPLs.

BRIEF DESCRIPTION OF THE DRAWINGS

The disclosure may be understood by reference to the following description taken in conjunction with the accompanying drawings, in which like reference numerals identify like elements, and in which:

FIGS. 1a-1i illustrate a method for the manufacture of a semiconductor device employing an OPL according to an example of the present invention.

Figure 1C:
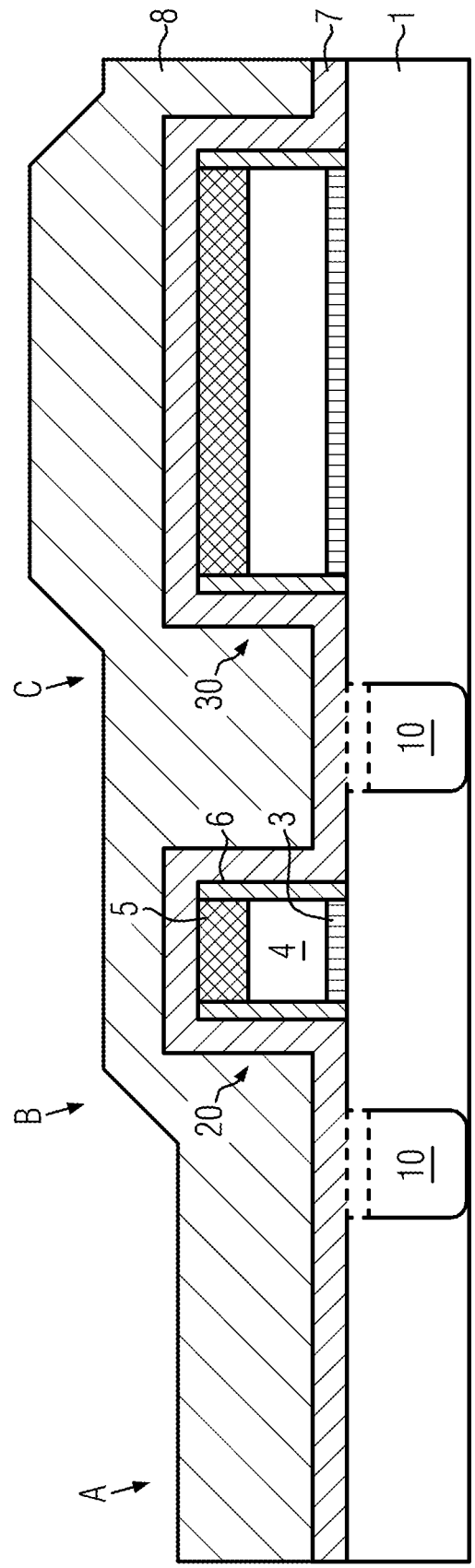

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure is directed to various methods of forming semiconductor devices while preventing or reducing loss of semiconductor material of a large active device area. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, etc.

The present disclosure provides a method for the manufacture of a semiconductor device, including the steps of providing a semiconductor substrate having a first area separated from a second area by a first isolation region, wherein the second area includes an intermediate transistor comprising a gate electrode, forming an oxide layer over the first and second areas, forming an optical planarization layer (OPL) over the oxide layer, forming a mask layer over the OPL in the first area without covering the OPL in the second area, and etching the OPL with the mask layer being present to expose the oxide layer over the gate electrode of the transistor. The OPL is etched back, the oxide layer is opened and a protective cap layer covering the gate electrode is removed with the mask layer and the OPL in the first area being present.

An exemplary starting point for an example of the provided method is shown in FIG. 1a. In the shown stage, an intermediate semiconductor device, for example, an integrated circuit product, comprises three different areas. Area A is an active device area that may, for example, comprise a processor. Area B may be an area of medium PC pattern density and area C may be an area of high PC pattern density, for example, the high-K metal gate poly density as seen from a top view of the chipset.

According to an example, area B is a logic/SRAM area and area C is a passive device area. The different areas A, B and C are separated from each other by insulating regions 10, for example, (shallow) trench isolations, formed in the semiconductor substrate 1. The semiconductor substrate 1 may be the same in areas A, B and C.

The semiconductor substrate 1 may comprise a semiconductor layer, which in turn may be comprised of any appropriate semiconductor material, such as silicon, silicon/germanium, silicon/carbon, other II-VI or III-V semiconductor compounds and the like. The semiconductor layer may comprise a significant amount of silicon due to the fact that semiconductor devices of high integration density may be formed in volume production on the basis of silicon, due to the enhanced availability and the well-established process techniques developed over the last decades. However, any other appropriate semiconductor materials may be used, for instance, a silicon-based material containing other iso-electronic components, such as germanium, carbon and the like. Furthermore, the substrate 1 and the semiconductor layer may define a silicon-on-insulator (SOI) configuration. The semiconductor substrate 1 may be a silicon substrate, in particular, a single crystal silicon substrate. Other materials may be used to form the semiconductor substrate 1 as, for example, germanium, silicon/germanium, gallium phosphate, gallium arsenide, etc.

As can be seen from FIG. 1a, a mask layer 2 is formed on the surface of the semiconductor substrate 1. It was patterned and used for the formation of the insulating regions 10. For example, the mask layer 2 may be provided in the form of an oxide layer. Area B comprises a transistor 20, for example, an NFET. Typical critical dimensions in area B may generally be in the range of 45 nm or below. In particular, the channel length may be below 50 nm, in particular, below 20 nm, for example. The transistor 20 comprises a gate electrode 4 formed on a gate isolation layer 3 (gate dielectric) which separates the gate electrode 4 from a channel region defined in the semiconductor layer of the semiconductor substrate 1. The gate electrode 4 may comprise polysilicon. In principle, the gate electrode 4 may comprise a plurality of diffusion layers which may comprise an appropriate metal species, such as aluminum and/or lanthanum. The gate isolation layer 3 may be provided in the form of a silicon oxide-based material, such as silicon oxynitride and the like, followed by a high-k dielectric material, such as hafnium oxide, hafnium silicon oxide and the like. It may be provided by oxidation and deposition techniques in combination with any other appropriate surface treatments and the like. The gate electrode 4 is covered by a protective cap layer 5, for example, an SiN layer. Moreover, sidewall spacers 6 are formed on sidewalls of the gate electrode 4. In principle, area C may comprise a transistor or a resistor 30 or one or more resistors and/or capacitors, etc.

In the manufacturing stage shown in FIG. 1b, a sacrificial oxide layer 7 is formed above all three areas A, B and C. Particularly, the sacrificial oxide layer 7 covers the protective cap layer 5 of the gate structure of the transistor 20 in area B and spacer 6, as well as the mask layer 2 formed on the substrate 1 and the isolation trenches 10. The sacrificial oxide layer 7 may be a relatively thin layer of below 10 nm thickness, for example, a CFD oxide.

After deposition of the sacrificial oxide liner 7, an organic optical planarization layer (OPL) 8 is formed over the entire structure, as is illustrated in FIG. 1c. The OPL 8 may comprise spin-on-carbon. Some particular examples of OPLs are ODL (commercially available from Shin-etsu Chemical, Co., Ltd) and a top coating composition known as NFC (commercially available from Japan Synthetic Rubber). For example, the OPL layer 8 may be a layer of CHM701B, commercially available from Cheil Chemical Co., Ltd., HM8006 and HM8014, commercially available from JSR Corporation, and ODL-102, commercially available from Shin-etsu Chemical, Co., Ltd. The OPL layer 8 may be formed by performing a spin-coating process and thereafter drying the OPL material. Particularly, in the case that area C represents an area with a high PC pattern density, the OPL may be formed with essentially the same thickness on the component 30 as on the substrate 1. The thickness of the OPL may be in the range of 100-900 nm, for example.

Next, a patterned mask layer 9 is formed. After patterning of a suitably formed mask, the patterned mask layer 9 particularly covers the active device area A (see FIG. 1d). In the shown example, the insulating region 10 separating areas A and B is also covered by the patterned mask layer 9. The patterned mask layer 9 may be provided, for example, as a photoresist coating. After exposure of the photoresist coating by means of a suitably shaped mask, a patterned mask layer 9 results.

Figure 1D:
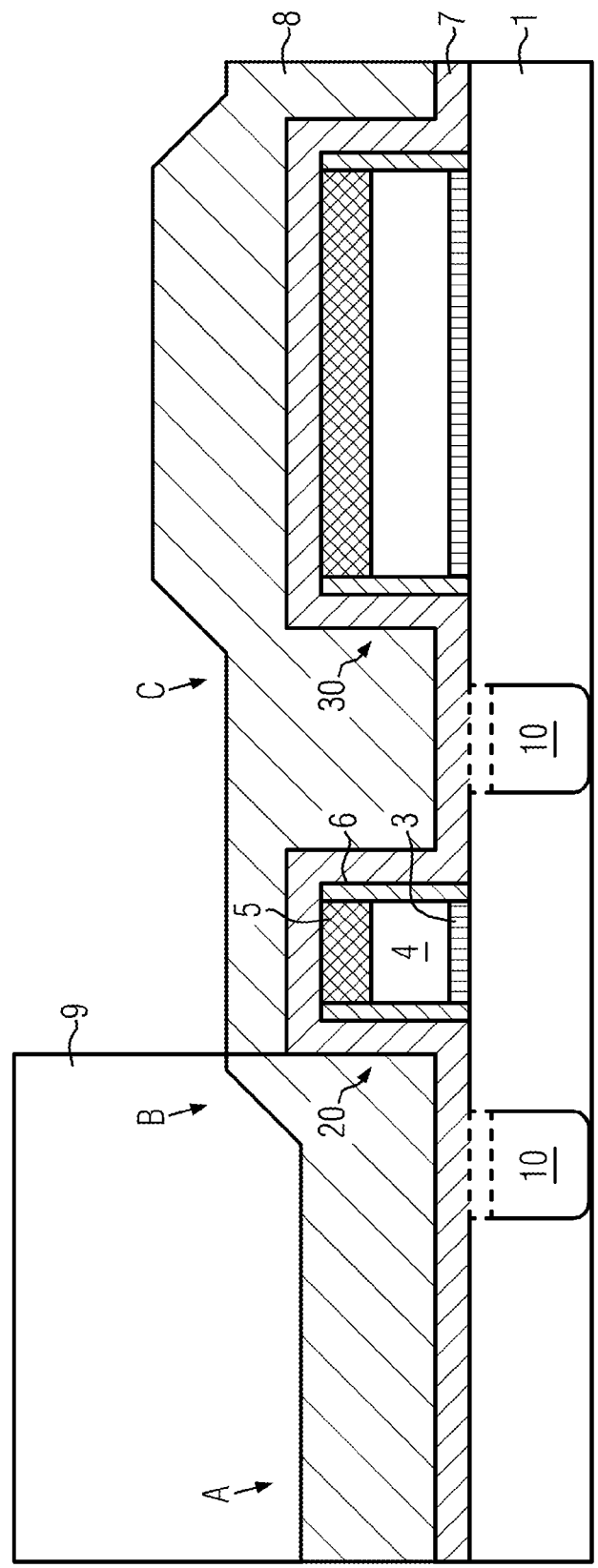
Figure 1E:
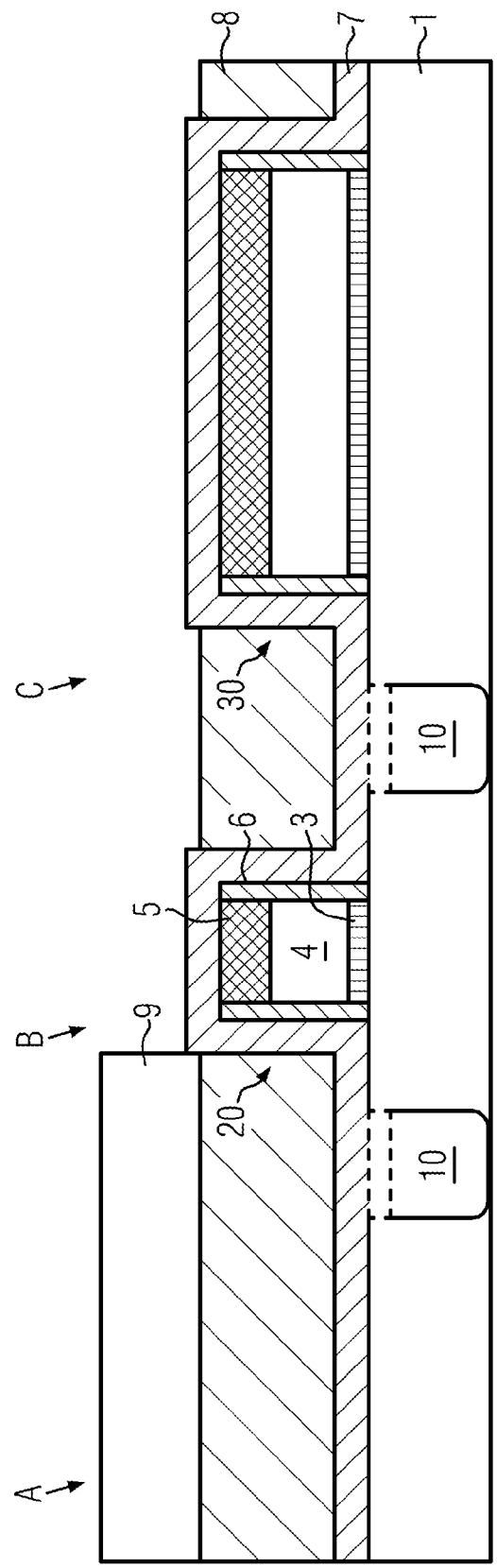

Back-etching of the OPL 8 results in the configuration illustrated in FIG. 1e. While maintaining OPL 8 in the region above the insulating region 10 separating areas B and C, the OPL 8 is etched back to expose the sacrificial oxide layer 7 atop of the protective cap layer 5 of the transistor 20 in region B. Back-etching is performed for a sufficiently long time period such that the upper surface of the etched back OPL 8 is below the upper surface of the sacrificial oxide layer 7 but above the upper surface of the protective cap layer 5 in the shown example. Back-etching of the OPL 8 may be performed by an argon/oxygen-based process, for example.

After change of the etching chemistry, the sacrificial oxide layer 7 is opened to expose the protective cap layer 5, as illustrated in FIG. 1f. Opening of the sacrificial oxide layer 7 may be achieved by an anisotropic etching process. A variant of etchant materials may be used, for example, $CHF_3$/He. Note that the mask layer 9 is present during both back-etching of the OPL 8 and opening of the sacrificial oxide layer 7 in order to expose the protective cap layer 5. Some portion of the OPL 8 is also consumed during this etching process. The upper surface of the OPL 8 may be lowered below the upper surface of the protective cap layer 5. The remaining oxide layer 7 on the sidewall spacers 6 protects the sidewall spacers 6 that are typically made of a material similar to the protective cap layer 5 during the subsequent removal of the protective cap layer 5.

Again, after change of etching chemistry (now an etching chemistry for etching SiN with a high selectivity with respect to the sacrificial oxide is to be chosen), the exposed protective cap layer 5 is removed, as illustrated in FIG. 1g. Removal of the protective cap layer 5 may comprise a relatively aggressive main etching process etching through most of the protective cap layer 5 followed by a relatively non-aggressive over-etch process. After completion of the removal of the protective cap layer 5, the OPL 8 may even be completely consumed in regions where it is not protected by the patterned mask layer 9. However, the semiconductor substrate 1 in the active device area A and the insulating region 10 separating areas A and B (and the oxide layer 7 formed thereon) are protected by both the patterned mask layer 9 and the OPL layer 8. The dry cap removal starts with the mask layer 9 (partly) still being present. It is noted that etching the OPL, the sacrificial oxide layer and the protective cap layer may be carried out in a single process chamber without removing the substrate from the chamber in order to accelerate the overall processing and avoid contamination.

FIG. 1h shows a resulting configuration after removal of the remaining mask layer 9 and OPL 8. After removal of the remaining sacrificial oxide 7 (FIG. 1i), the configuration may be subject to any desired further processing. Removal of the remaining sacrificial oxide 7 may be performed by a plasma strip process that ensures that residual portions of the OPL 8 are also removed.

In the configuration shown in FIG. 1h or FIG. 1i, a metal silicide region (not shown) may be formed in the upper portion of the gate electrode 4. The metal silicide region may be formed on the basis of refractory metals, such as nickel, platinum and the like, that may be deposited and may be converted into a metal silicide by performing an appropriate heat treatment, for example, in the form of a rapid thermal anneal. Thereafter, any non-reacted metal material may be removed on the basis of well-established selective etch techniques, wherein additional heat treatments for stabilizing the overall characteristics may follow, if required. During the silicidation process, the spacer structures 6 may reliably cover the sidewalls of the gate electrode 4, thereby avoiding significant metal "wraparound" so that enhanced controllability and uniformity of the silicidation process may be accomplished.

Thus, according to the described method, due to the provision of the mask layer 9 formed on the OPL both over the area A and the insulating region 10 separating areas A and B, the active device area A and the insulating region 10 are not affected by the etching of the sacrificial oxide layer 7 and the protective cap layer 5.

One crucial step in the above-described processes is the back-etching of the OPL. The remaining thickness of the back-etched OPL has to be carefully controlled. Conventionally, in OPL gap filling processes, a number of etch-back tests has to be performed for a corresponding number of wafers (herein the terms "wafer" and "semiconductor substrate" are used interchangeably). In the art, for optimization of the OPL etch-back process, for example, a first OPL deposition followed by a first OPL etch-back is carried out on a first wafer, a second OPL deposition followed by a second OPL etch-back is carried out on a second wafer, and a third OPL deposition followed by a third OPL etch-back is carried out on a third wafer. Each of the first, second and third wafer is subsequently physically destroyed in order to determine the characteristics of the remaining OPL on different structures and between gate lines, for example, after the etch-back process.

This conventional test procedure is time consuming and expensive in terms of the waste of wafers. Therefore, a new etch process test based on atomic force microscopy (AFM) is provided. According to this new process, after etch-back of the OPL, for example, a configuration as shown in FIG. 1 e is examined by in-line AFM in order to determine characteristics of the remaining OPL. After removal of the remaining OPL and resist rework, if appropriate, a new OPL is deposited and etched back on the same wafer. A second etch-back test based on AFM is carried out on the same wafer for the second deposited and back-etched OPL. This sequence may be repeated on the same wafer until optimized parameters for the etch-back process are determined. This new approach may be applied to the method described above with reference to FIGS. 1a-1i. It goes without saying that the AFM-based etch-back test may be applied to any OPL gap fill process.

Figure 2A:
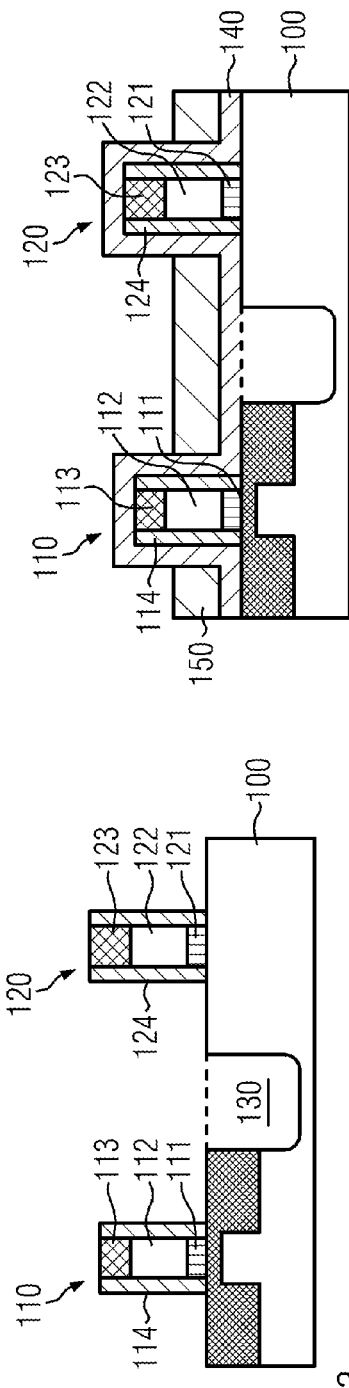
FIGS. 2a-2f illustrate a method for an OPL etch-back test procedure disclosed herein.

Consider a typical situation wherein a PMOS 110 and an NMOS 120 transistor are formed on a semiconductor substrate 100, as illustrated in FIG. 2a. The semiconductor substrate 100 may comprise a semiconductor layer, which in turn may be comprised of any appropriate semiconductor material, such as silicon, silicon/germanium, silicon/carbon, other II-VI or III-V semiconductor compounds and the like. The semiconductor layer may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. Furthermore, the substrate 100 and the semiconductor layer may define an SOI configuration. The semiconductor substrate 100 may be a silicon substrate, in particular, a single crystal silicon substrate. Other materials may be used to form the semiconductor substrate 100 as, for example, germanium, silicon/germanium, gallium phosphate, gallium arsenide, etc. The transistors 110 and 120 are separated from each other by a shallow trench isolation 130.

Figure 2B:
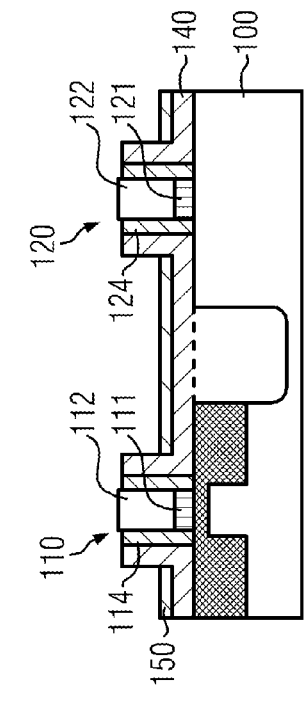
Figure 2C:
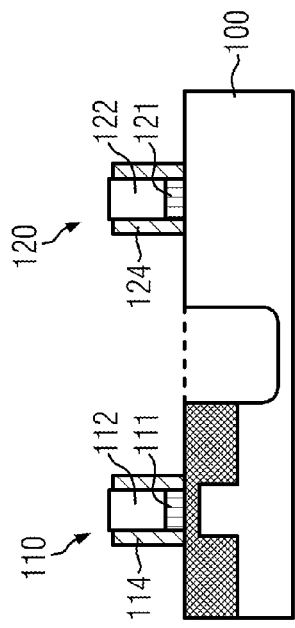

Each of the transistors 110 and 120 comprises a gate dielectric 111 and 121, respectively, a gate electrode 112 and 122, respectively, and a protective cap layer, for example, an SiN layer, 113 and 123, respectively. An oxide layer 140 is deposited over the entire structure, as shown in FIG. 2b. The thickness of the oxide layer 140 may be in the range of 10-90 nm. As shown in FIG. 2c, an OPL 150 is deposited on the oxide layer 140. The thickness of the OPL 150 may be in the range of 100-500 nm.

Figure 2D:
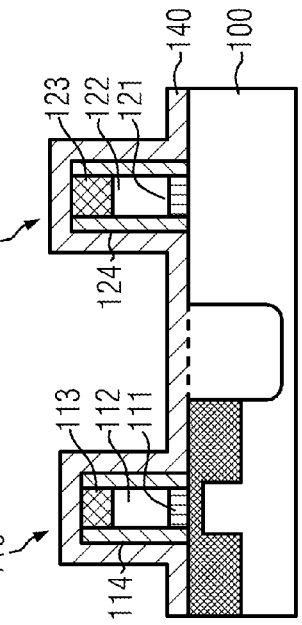
Figure 2E:
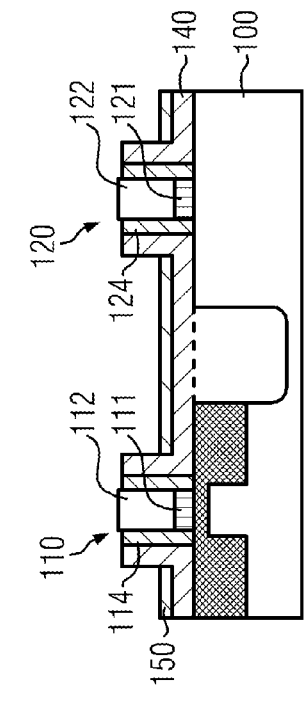
Figure 2F:
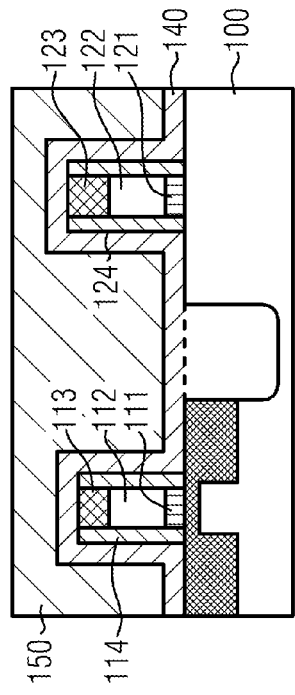

The OPL 150 is etched back such that the upper surface of the remaining OPL 150 is below the upper surface of the protective cap layers 113 and 123 (FIG. 2d). The oxide layer 140 is opened in order to expose the protective cap layers 113 and 123, and the protective cap layers 113 and 123 are subsequently removed, for example, by a nitride etch process (FIG. 2e). The remaining oxide layer 140 is removed in order to achieve the semiconductor device shown in FIG. 2f.

The crucial step of the OPL etch-back process (FIG. 2d) has to be optimized. In the art, a first OPL deposition followed by a first OPL etch-back as shown in FIG. 2d is carried out on a first wafer, a second OPL deposition followed by a second OPL etch-back is carried out on a second wafer, and a third OPL deposition followed by a third OPL etch-back is carried out on a third wafer. Each of the first, second and third wafer is subsequently physically destroyed in order to determine the characteristics of the remaining OPL on different structures and between gate lines, for example, after the etch-back process.

According to the etch-back test process provided herein, no wafer is destroyed for inspecting the etched back OPL. Rather, after etch-back of the OPL (FIG. 2d), the configuration shown in FIG. 2d is examined by in-line AFM in order to determine characteristics of the remaining OPL. After removal of the remaining OPL and resist rework, if appropriate, a new OPL is deposited and etched back on the same wafer. A second etch-back test based on AFM is carried out on the same wafer for the second deposited and back-etched OPL. This sequence may be repeated on the same wafer until optimized parameters for the etch-back process are determined.

As a result, the present disclosure provides manufacturing techniques for semiconductor devices employing OPLs. Particularly, a mask layer and an OPL are present over an active device area of a semiconductor substrate during etching of a protective cap layer formed on a gate electrode of a transistor formed in another area of a semiconductor substrate and exposed by opening an oxide layer previously formed over the structure. Thus, the active device area is efficiently protected during the process of etching the protective cap layer. The etching of the protective cap layer is preceded by an etch-back process performed for the OPL in order to expose a sacrificial oxide layer formed on the protective cap layer. The OPL etch-back is crucial since, in particular, OPL material should be maintained in regions adjacent to the transistor during exposure of the oxide layer. Herein, in-line AFM is used for performing the etch-back test process. Different from the art, no waste of wafers is necessary.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for the manufacture of a semiconductor device, the method comprising:
   providing a semiconductor substrate comprising a first active device area separated from a second active device area by a first isolation region formed in said semiconductor substrate, wherein said second active device area comprises a transistor in an intermediate processing stage, said transistor comprising a gate electrode;
   forming a sacrificial oxide layer over said first and second active device areas;
   forming an optical planarization layer (OPL) over said sacrificial oxide layer, said OPL covering at least said first and second active device areas;
   forming a patterned mask layer over said OPL, said patterned mask layer covering at least said first active device area and exposing at least a portion of said OPL formed above said second active device area; and
   etching said exposed portion of said OPL in the presence of said patterned mask layer to expose a portion of said sacrificial oxide layer formed over said gate electrode of said transistor.

2. The method of claim 1, wherein said patterned mask layer covers said first isolation region during said etching of said exposed portion of said OPL.

3. The method of claim 1, wherein said semiconductor substrate comprises a third active device area separated from said second active device area by a second isolation region formed in said semiconductor substrate and wherein said sacrificial oxide layer and said OPL are formed over said second isolation region and said third active device area.

4. The method of claim 3, wherein said second active device area comprises a plurality of devices having a first pattern density and said third active device area comprises a plurality of devices having a second pattern density that is higher than said first pattern density.

5. The method of claim 1, wherein said gate electrode is covered by a protective cap layer, the method further comprising etching said exposed portion of said sacrificial oxide layer to expose said protective cap layer and subsequently etching said protective cap layer in the presence of said patterned mask layer.

6. The method of claim 5, wherein etching said protective cap layer comprises performing a main etch process followed by performing an over-etch process.

7. The method of claim 6, further comprising, after etching said protective cap layer, removing said patterned mask layer, and removing remaining portions of said OPL and remaining portions of said sacrificial oxide layer from above said first and second active device areas.

8. The method of claim 5, wherein, after etching said exposed portion of said sacrificial oxide layer, an upper surface of said OPL formed above said second active device area is at a height level that is below an upper surface of said protective cap layer.

9. The method of claim 5, further comprising wherein said transistor comprises sidewall spacers, the method further comprising maintaining said sacrificial oxide layer on side surfaces of said sidewall spacers after etching said exposed portion of said sacrificial oxide layer to expose said protective cap layer.

10. The method of claim 9, wherein said sacrificial oxide layer is formed on said sidewall spacers.

11. The method of claim 10, wherein said protective cap layer and said sidewall spacers are comprised of silicon nitride.

12. The method of claim 5, further comprising forming a silicide region in said gate electrode.

13. The method of claim 5, wherein etching said OPL, etching said exposed sacrificial oxide layer, and etching said exposed protective cap layer are all performed in a single process chamber without removing said substrate from said single process chamber.

14. The method of claim 1, wherein forming said patterned mask layer comprises forming a photoresist coating on said OPL and patterning said photoresist coating to cover said first area and expose said second area.

15. The method of claim 1, further comprising performing an etch-back test process for the step of etching said OPL by inspecting the etched OPL by means of atomic force microscopy (AFM).

16. The method of claim 15, wherein performing said etch-back test process comprises forming a first OPL over said sacrificial oxide layer on said wafer, etching back said first OPL on said wafer, examining the etched-back first OPL by in-line AFM in order to determine characteristics thereof, removing said first OPL, forming a second OPL over said sacrificial oxide layer on the same wafer, etching back said second OPL on the same wafer, and examining the etched-back second OPL by in-line AFM in order to determine characteristics thereof on the same wafer.

17. The method of claim 1, wherein forming said sacrificial oxide layer comprises conformally depositing said sacrificial oxide layer.

18. The method of claim 1, wherein, after exposing said portion of said sacrificial oxide layer formed over said gate electrode, at least a portion of said OPL remains above said at least said portion of said second active device area.

19. The method of claim 1, further comprising, after exposing said portion of said sacrificial oxide layer formed over said gate electrode, removing an entirety of said sacrificial oxide layer from above said first and second active device areas.

20. A method, comprising:
   forming a trench isolation region in a semiconductor layer of a semiconductor substrate, said trench isolation region laterally separating first and second active device areas formed in said semiconductor layer;
   forming a gate structure of a transistor above said second active device area, said gate structure comprising a gate dielectric layer, a gate electrode formed above said gate dielectric layer, and a dielectric cap layer formed above said gate electrode;
   conformally depositing a sacrificial dielectric layer above said first and second active device areas, said sacrificial dielectric layer covering sidewalls of said gate structure and an upper surface of said dielectric cap layer;
   forming an optical planarization layer above said sacrificial dielectric layer, said optical planarization layer covering said first and second active device areas;
   forming a patterned mask layer above said optical planarization layer, said patterned mask layer covering said optical planarization layer formed above said first active device area and exposing at least a portion of said optical planarization layer formed above said second active device area;

performing an etch-back process on said exposed portion of said optical planarization layer in the presence of said patterned mask layer to expose a portion of said sacrificial oxide layer formed above said gate structure; and after performing said etch-back process, completely removing said sacrificial dielectric layer from above said first and second active device areas.

21. The method of claim 20, further comprising, prior to completely removing said sacrificial dielectric layer from above said first and second active device areas, performing a first etching process to remove said exposed portion of said sacrificial oxide layer from above said gate structure so as to expose said dielectric cap layer, and performing a second etching process to remove said exposed dielectric cap layer from said gate structure so as to expose said gate electrode.

22. The method of claim 20, further comprising, prior to completely removing said sacrificial dielectric layer from above said first and second active device areas, removing remaining portions of said optical planarization layer from above said first and second active device areas.

* * * * *